United States Patent [19]
Bergmann et al.

[11] Patent Number: 6,081,048
[45] Date of Patent: Jun. 27, 2000

[54] MODULAR PERIPHERAL UNIT EXPANDABLE BY MODULES AND HAVING AN AUTOMATICALLY ESTABLISHING ELECTRICAL CONNECTION

[75] Inventors: Martin Bergmann, Schnaittenbach; Heribert Rester, Steinberg; Reinhard Schirbl, Schwandorf, all of Germany

[73] Assignee: Siemens Aktiengesellschaft, Munich, Germany

[21] Appl. No.: 09/171,643

[22] PCT Filed: Apr. 14, 1997

[86] PCT No.: PCT/DE97/00749

§ 371 Date: Oct. 22, 1998

§ 102(e) Date: Oct. 22, 1998

[87] PCT Pub. No.: WO97/41714

PCT Pub. Date: Nov. 6, 1997

[30] Foreign Application Priority Data

Apr. 25, 1996 [DE] Germany ............. 296 07 525 U

[51] Int. Cl.[7] .................................................. H05K 7/02
[52] U.S. Cl. ........................ 307/147; 361/735; 439/928
[58] Field of Search ........................... 439/928; 361/731, 361/732, 733, 735, 744, 790; 307/147

[56] References Cited

U.S. PATENT DOCUMENTS 4,790,762  12/1988  David et al. .
5,493,194   2/1996  Damiano et al. ............... 361/733
5,752,838   5/1998  Nishizawa ...................... 439/928

FOREIGN PATENT DOCUMENTS 0 499 675  8/1992  European Pat. Off. .
0 527 247  2/1993  European Pat. Off. .
37 40 290  6/1989  Germany .
2 014 367  8/1979  United Kingdom .

*Primary Examiner*—Jeffrey Gaffin
*Assistant Examiner*—Rios Roberto
*Attorney, Agent, or Firm*—Kenyon & Kenyon

[57] ABSTRACT

A modular peripheral unit, which monitoring a technical process, includes a base module to which at least one expansion module can be attached in series, the modules each having a module upper part and a module lower part, as well as having at least one profile permitting serial attachments. The module lower parts have a multiplicity of essentially U-shaped contact elements in the region of the profile with which they can be attached in series. One limb of the contact elements extends into the interior of the module lower part, such that the multiplicity of these limbs form an internal male contact strip and the multiplicity of remaining limbs of the contact elements form an external male contact strip. When an expansion module is attached in series, the external male contact strip engages in the expansion module such that the external male contact strip is opposite the internal male contact strip of the expansion module which is attached in series. The desired connection between the internal and external male contact strips can be achieved within the module with suitable measures.

6 Claims, 5 Drawing Sheets

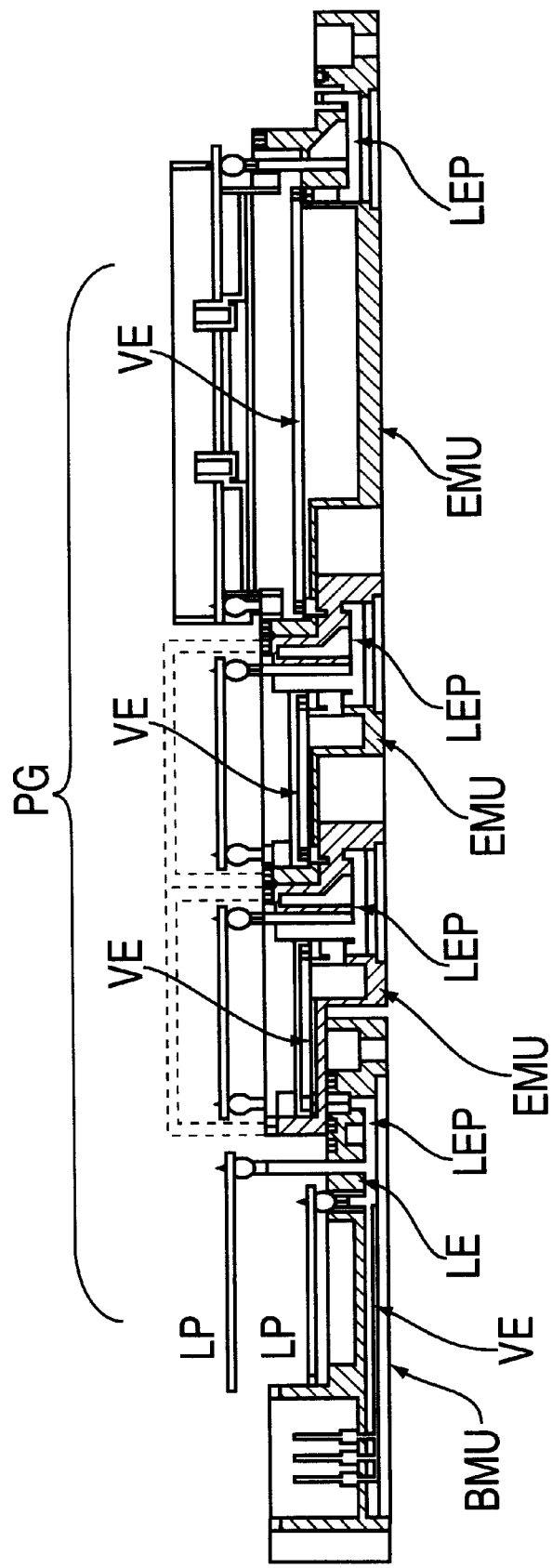

6,081,048

MODULAR PERIPHERAL UNIT EXPANDABLE BY MODULES AND HAVING AN AUTOMATICALLY ESTABLISHING ELECTRICAL CONNECTION

FIELD OF THE INVENTION

The present invention relates to a modular peripheral unit which can be expanded by assemblies for controlling and/or monitoring a technical process. The peripheral unit includes a base module to which at least one supply voltage can be supplied and to which at least one expansion module can be attached in series. In this case, both the base module and the at least one expansion module, which can be attached in series, can be connected to actuators and/or sensors for controlling and/or monitoring the technical process.

BACKGROUND INFORMATION

Peripheral units are generally known in the related art. The company Siemens AG produces the ET200U modular peripheral unit, for example. In the conventional design of automation systems, sensors and actuators are connected directly to the central automation unit. In the case of widely branched systems, this leads to complex wiring systems with high wiring costs, and reduced flexibility in the event of changes and additions.

Local peripheral units thus form an efficient interface between the process and the central automation unit. The processing and conversion of the process signals, the interaction with sensors and actuators, is carried out directly on site, that is to say, is also physically assigned to the process or the process element. The connection between the peripheral unit and the central automation unit is, in this case, normally produced via a field bus, and thus via a single connection.

Furthermore, integral peripheral units having a high degree of protection (IP66/IP67) are known, for example, the ET200C peripheral unit marketed by the company Siemens AG, which are primarily suitable for use in a harsh industrial environment.

In contrast, no peripheral units are known in which the necessary electrically conductive connections between the individual modules are produced during expansion without any additional contact means, such as plugs or cables. Furthermore, no modularly expandable peripheral units are yet known in the related art which can be expanded in a modular manner while at the same time affording a high degree of protection.

SUMMARY OF THE INVENTION

The object of the present invention is to provide a peripheral unit for controlling and/or monitoring a technical process, the unit being capable of expansion in a modular manner by assemblies, and the required electrically conductive connections and contact points being produced when the peripheral unit is assembled.

The object for a modular peripheral unit which is expandable by assemblies, which includes a base module to which at least one expansion module can be attached in series, is achieved in that the modules have a module upper part and a module lower part, the module lower parts each have a profile such that they can be attached in series to one another, the module lower parts have a multiplicity of essentially U-shaped contact elements in the region of the profile with which they can be attached in series to one another, one limb of the U-shaped contact elements is located within the module when the module upper part is mounted, such that the multiplicity of these limbs of the U-shaped contact elements form an internal contact arrangement, the other limb of the U-shaped contact elements is located outside the module even when the module upper part is mounted, such that the multiplicity of these limbs of the U-shaped contact elements form an external contact arrangement and, the external contact arrangement engages in an expansion module when the expansion module is attached in series, such that the external contact arrangement is opposite the internal contact arrangement of the expansion module which is attached in series.

In another embodiment according to the present invention, the essentially U-shaped contact elements LE have junctions. In this way, the U-shaped contact elements offer the possibility of a multiple pick-off for the signal or supply voltage which is applied to the respective contact element.

In another embodiment according to the present invention, some of the essentially U-shaped contact elements are used for passing on the at least one supply voltage, and some of the essentially U-shaped contact elements are used to pass on signal voltages. In this way, it is possible in an advantageous manner to use the contact elements both for passing on the at least one supply voltage and for passing on the signal voltages, a significant physical separation nevertheless being ensured within the module between the signal voltages and the at least one supply voltage.

In another embodiment according to the present invention, the peripheral unit is distinguished by the fact that the module upper parts have an electrical circuit which is applied to a printed circuit board and controls and/or monitors the technical process. This is advantageous primarily with respect to the fact that each module upper part is fastened only to the corresponding module lower part by at least one fastening means arrangement, and that the operation of the fastening means is not obstructed by other module upper parts or module lower parts. For this reason, the electronics or electrical circuit, arranged in the module upper part and applied on a printed circuit board, can be replaced easily for maintenance or in the event of changes to the system configuration, without having to detach the other module upper parts or even to sever the connection between the module lower parts.

BRIEF DESCRIPTION OF THE DRAWINGS

FIG. 5 shows a section through the modular peripheral unit along the section line V illustrated in FIG. 3.

DETAILED DESCRIPTION

Figure 1:
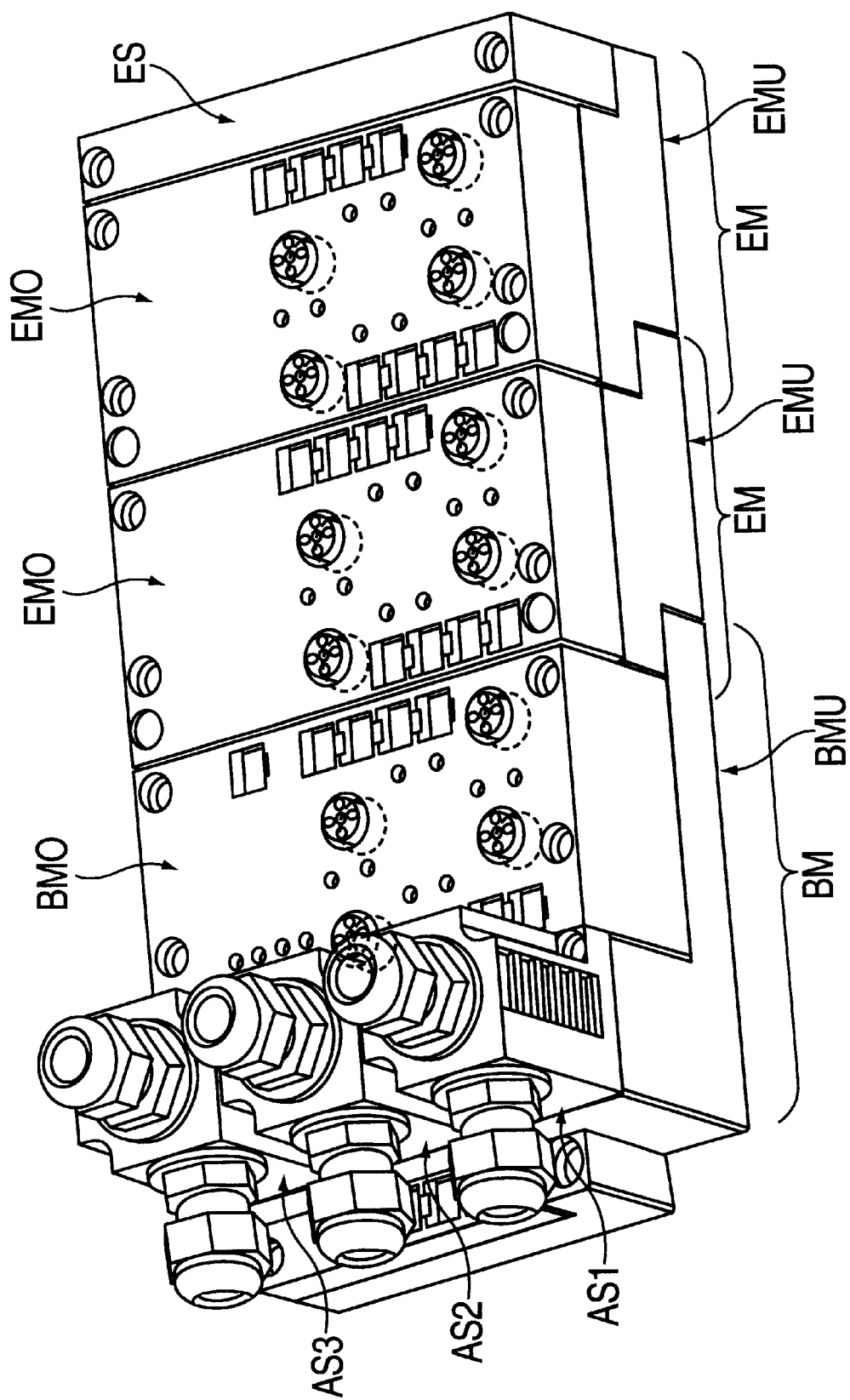
FIG. 1 shows a modular peripheral unit which can be expanded by assemblies, in an assembled state.

As illustrated in FIG. 1, base module BM includes a base module lower part BMU and a base module upper part BMO. The expansion module EM includes, in a corresponding manner, an expansion module lower part EMU and an expansion module upper part EMO.

The base module lower part BMU and expansion module lower part EMU have a profile that permits them to be attached in series to one another, so that base module lower part BMU and expansion module lower part EMU, as well as expansion module lower part EMU and a further expansion module lower part EMU can be attached in series in a positively locking manner. A stepped profile is used in the exemplary embodiment.

Figure 2:
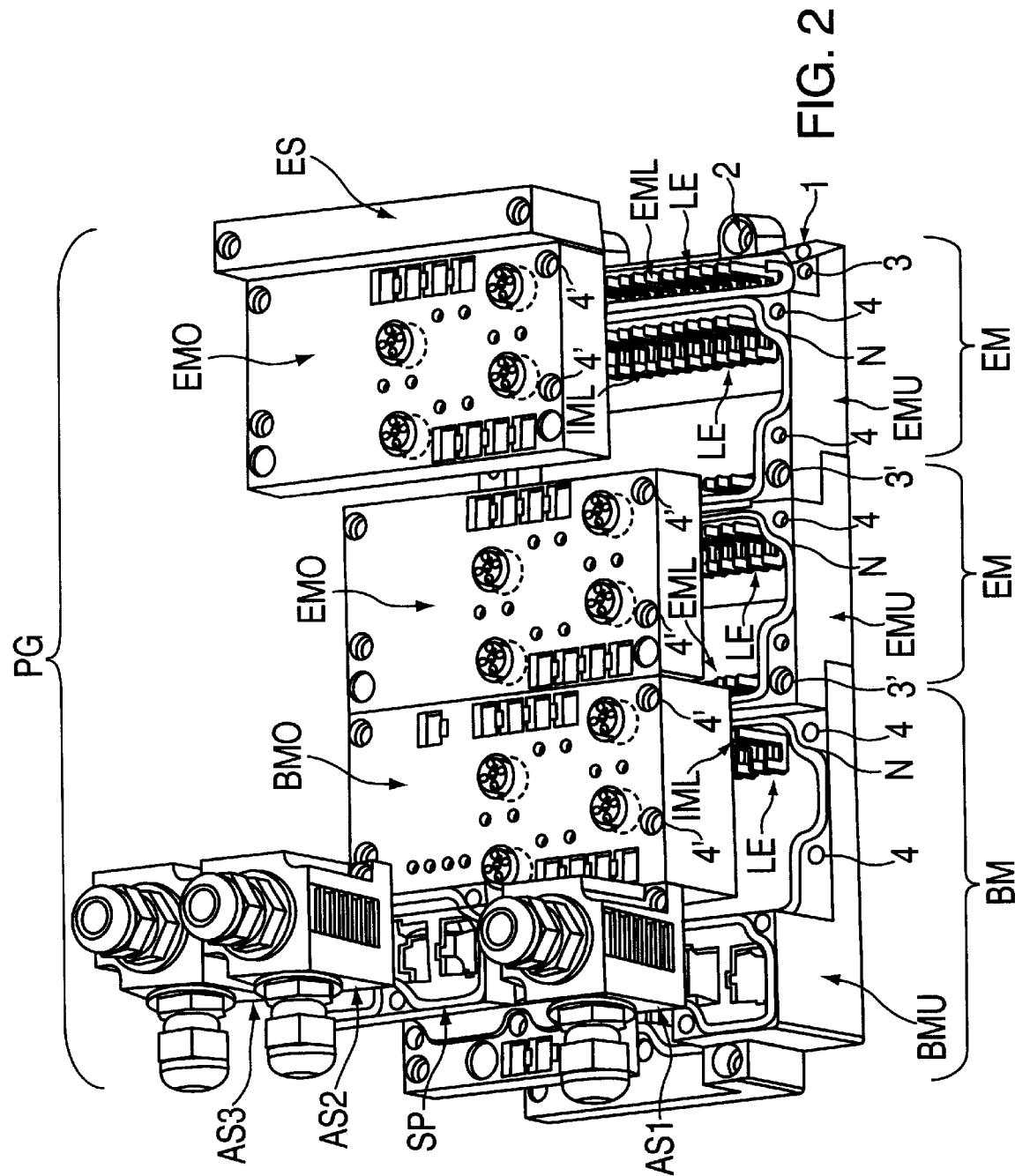
FIG. 2 shows a partially enlarged illustration of the modular peripheral unit illustrated in FIG. 1 which can be expanded by the assemblies.

FIG. 2 shows peripheral unit PG partly exploded, module lower parts, BMU, EMU, already being attached in series to one another. Module lower parts, BMU, EMU, are attached in series with an integral fit, since module lower parts, BMU, EMU, are guided by interacting, positively locking holders 1 and positively locking elements which are not depicted, for example, a dovetail and a dovetail holder 1. The positively locking connection of module lower parts, BMU, EMU, makes the serial attachment design of modular peripheral unit PG self-supporting.

This integrally fitting guidance is necessary in order that the elements of the sealing system engage exactly in one another. In order to achieve a high degree of protection, the sealing system in the exemplary embodiment is designed as a tongue-and-groove combination. The tongue of module upper part (module), BMO, EMO, engages in groove N in module lower part BMU, EMU. The seal is produced by foam-filling groove N in module lower part, BMU, EMU, so as to close the pores. Both individual modules, BM, EM, and peripheral unit PG which can be expanded thus comply with the criteria for degree of protection IP65 in accordance with DIN IEC 529 standard.

The module lower parts, BMU, EMU, are normally fastened on a mounting surface, for which purpose module lower parts, BMU, EMU, have holes 2 into which fastening means, such as screws, for example, can be inserted. The module lower parts, BMU, EMU, can be individually fixed onto the mounting surface using the fastening means.

Module lower parts, BMU, EMU, attached in series to one another, are fastened to one another by screw connections or by equivalent fastening means. Module lower parts, BMU, EMU, have holes 3, 3' for this purpose, into which, for example, screws can be inserted. In an embodiment which is not depicted, module lower parts, BMU, EMU, attached in series to one another, are fastened by the insertion of wedge-shaped locking means (arrangement).

Furthermore, as can be seen in particular from FIG. 2, module upper parts, BMO, EMO, can be removed from respective lower parts, BMU, EMU, without undoing the connection of module lower parts, BMU, EMU, and thus can be replaced easily for maintenance or in response to a changed system configuration. This results from the fact that, in another embodiment, each module upper part, BMO, EMO, is fastened only to corresponding module lower part, BMU, EMU, by at least one fastening means, and the operation of the fastening means is not obstructed by other module upper parts, BMO, EMO, or module lower parts, BMU, EMU. The module upper part, BMO, EMO, has holes 4' for this purpose through which fastening means, for example, screws, can be passed, which engage in corresponding holes 4 in module lower part, BMU, EMU, so that module upper parts, BMO, EMO, can be fixed on module lower parts, BMU, EMU.

In the exemplary embodiment according to FIG. 1 and FIG. 2, base module BM has three connecting plugs AS1, AS2, AS3. Two of these connecting plugs AS2, AS3 are mounted together on a plug board SP. At least one supply voltage is normally supplied to peripheral unit PG via connecting plug AS1. The field bus line is looped through the peripheral unit, for example, via connecting plugs AS2, AS3. In this context, it is advantageous for connecting plugs AS2, AS3 to be mounted on plug board SP, since, if the incoming and the outgoing field bus line are connected in connecting plugs AS2, AS3, it is then unnecessary to interrupt the field bus line when detaching the plug-in unit, which is formed from connecting plugs AS2, AS3 and plug board SP. The communication connection between any further peripheral units PG thus remains uninterrupted.

The module lower parts, BMU, EMU, of individual modules, BM, EM, of modular peripheral unit PG have a multiplicity of contact elements LE which pass on the signal and supply voltage. Contact elements LE are designed as essentially U-shaped contact elements LE and are arranged in module lower parts BMU, EMU, on the side of the profile which permits them to be attached in series.

One limb of U-shaped contact elements LE is located within module, BM, EM, when module upper part, BMO, EMO, is mounted, such that the multiplicity of these limbs of U-shaped contact elements LE form an internal contact arrangement IML, an internal male contact strip IML in the exemplary embodiment. The other limb of U-shaped contact elements LE is located outside module, BM, EM, even when module upper part, BMO, EMO, is mounted, so that the multiplicity of these limbs of U-shaped contact elements LE form an external contact arrangement EML, an external male contact strip EML in the exemplary embodiment.

When an expansion module EM is attached in series to base module BM, external male contact strip EML of base module BM engages in expansion module EM such that external male contact strip EML of base module BM is opposite internal male contact strip IML of expansion module EM, which can be attached in series. The conditions described apply in a corresponding manner when a further expansion module EM is attached in series to an expansion module EM. In other respects, they can be seen particularly well from the illustration in FIG. 2.

The external male contact strip EML which is not covered by a further expansion module EM, which is attached in series, is covered instead by a special end piece ES. In the same way, end piece ES provides electric-shock protection and the sealing required for the desired degree of protection. Furthermore, it is thus possible to keep expansion modules EM essentially structurally identical, so that no special expansion module EM is required as a termination end module.

The desired electrically conductive connection between at least some of contact elements LE of the individual module lower parts, BMU, EMU, is realized by an electrical circuit to which can be connected sensors and/or actuators which are normally applied together with, or in conjunction with, module upper part, BMO, EMO.

Figure 3:
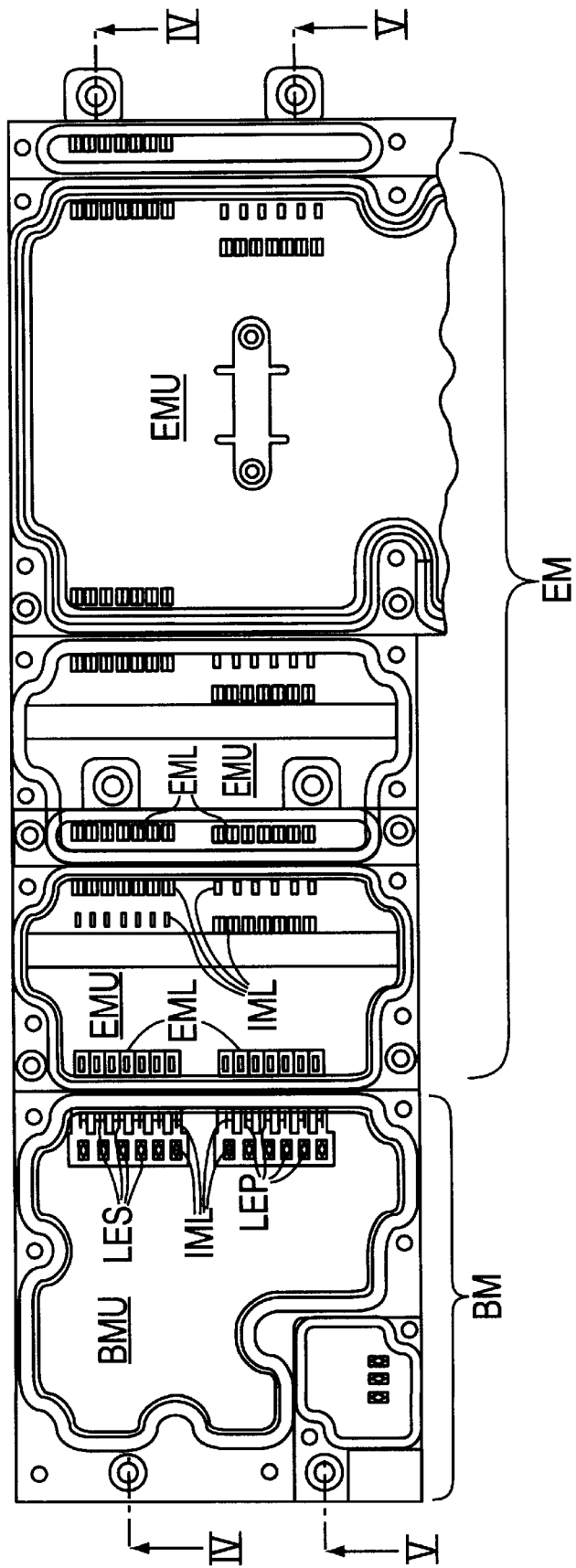
FIG. 3 shows a plan view of module lower parts (of the modular peripheral unit) which are attached in series to one another.

FIG. 3 shows a plan view of module lower parts, BMU, EMU, which are attached in series to one another. In each case, the internal male contact strip IML and external male contact strip EML can be seen. Some of contact elements LE of male contact strips, IML, EML, are used to pass on the at least one supply voltage, and other contact elements LE are used to pass on the signal voltages.

Figure 4:
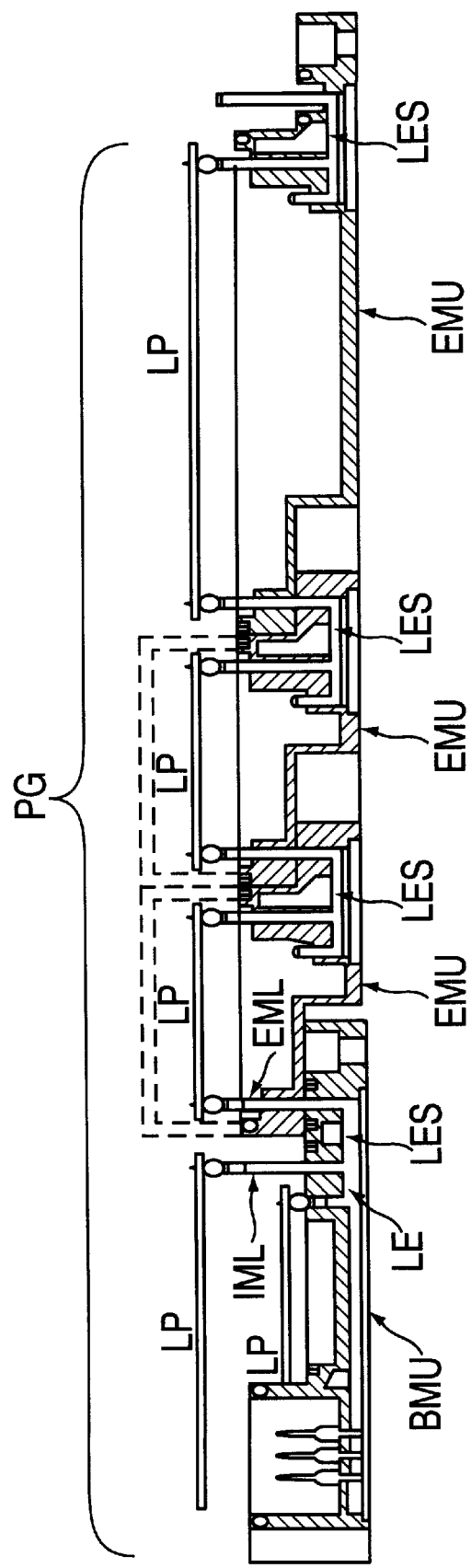
FIG. 4 shows a section through the modular peripheral unit along the section line IV illustrated in FIG. 3.

The manner in which the signal voltages are passed on can be seen particularly well with reference to FIG. 4. A field bus line can be connected to peripheral unit PG using connecting plugs AS2, AS3, which are not illustrated in FIG. 4. The signal voltages are fed into base module BM of peripheral unit PG using this field bus line. The signal voltages are passed to contact elements LE of internal male contact strip IML of base module BM by means of printed circuit boards LP which are arranged in base module BM. In this context, the electrically conductive connections between the undepicted contacts of connecting plugs AS2, AS3 and contact elements LE of internal male contact strip IML are realized via the printed circuit traces which are located on printed circuit boards LP.

Those contact elements LE of internal male contact strip IML which are used to pass on the signal voltage are designated in the following text by reference symbol LES.

Via essentially U-shaped contact elements LES, the signal voltages are also directly applied to external male contact strip EML and thus physically in the area of the expansion module EM, which is attached in series. The signal voltages are passed on from external male contact strip EML of base module BM to internal male contact strip IML of expansion module EM via printed circuit traces on a printed circuit board LP or via other suitable connecting means. In the exemplary embodiment, a printed circuit board LP is also arranged in expansion module upper part EMO. When the printed circuit board is mounted on expansion module lower part EMU, an electrically conductive connection is realized between contact elements on printed circuit board LP in expansion module upper part EMO and U-shaped contact elements LES. In the exemplary embodiment, a bus ASIC is located on printed circuit board LP. Integration of the respective expansion module EM in the data traffic occurring on the bus is ensured via bus ASIC. Furthermore, bus ASIC can also refresh the signal voltages which are passed on via the bus. The signal voltages entering bus ASIC are, of course, also passed on to any further expansion modules EM via the corresponding contact elements LES, in the previously described manner. If bus ASIC is dispensed with, it may also be conceivable to have a 1:1 connection of contact elements LES passing on the signal voltage, via the printed circuit traces on printed circuit board LP.

The manner in which the load voltages are passed on can be seen particularly well with reference to FIG. 5. The at least one supply voltage is supplied to base module BM of peripheral unit PG via connecting plug AS1, which is not illustrated in FIG. 5. The supply voltage is passed on to contact elements LE on internal male contact strip IML of base module BM from the undepicted contact elements of connecting plug AS1, within base module lower part BMU by means of electrically conductive connecting elements VE. In the following text, those contact elements LE which are used exclusively to pass on the supply voltage are designated by reference symbol LEP.

In contrast to the signal voltages, the supply voltages are not passed on from external male contact strip EML to internal male contact strip IML via the electrical circuit which is arranged on module upper part, BMO, EMO, but via suitable electrically conductive connecting elements VE which are arranged in module lower part BMU, EMU. This has the advantage that the load voltages need not, in every case, be passed via the electrical circuit which is arranged in module upper part, BMO, EMO, but are present where and only when they are actually required.

It is thus advantageous that only a selection of the supply voltages can be picked off on the electrical circuit which is arranged in module upper part, BMO, EMO, so that it becomes possible in the region of the electrical circuit to use only those supply voltages which are also actually required.

This is advantageous in particular with respect to the production of heat in the region of module upper part, BMO, EMO, as well as with respect to possible interference resulting from electromagnetic radiation. If a specific supply voltage is required in one of the electrical circuits which are arranged in module upper parts, BMO, EMO, then a corresponding contact element is designed such that the supply voltage can be picked off directly on printed circuit board LP. In this way, only those supply voltages are actually passed to the electrical circuit which are also actually required there. All the other supply voltages are looped through the relevant module, BM, EM, in the 1:1 form described above, by means of the respective connecting elements VE.

By attaching expansion modules EM in series, a self-forming bus results, it being possible for the bus to cover both signal and supply voltages. Controlling and/or monitoring a technical process is possible by picking off the supply voltages and evaluating the signal voltages with the aid of the electrical circuit which is arranged in module upper parts, BMO, EMO. Since the respective electrical circuit is arranged in module upper parts, BMO, EMO, it is easily replaceable for maintenance purposes. The electrical circuit which is located in module upper parts, BMO, EMO, can be electrically connected via suitable plug connectors, in particular via TIMER contacts, to the respective module lower parts, EMU, BMU, and to contact elements LE located in them. If necessary, the limbs of U-shaped contact elements LE have junctions, for example, for a multiple pick-off for the respective voltage.

All the display and connecting elements are arranged on the front, that is to say on module top, BMO, EMO, so that they are readily accessible for the connection of sensors and actuators relating to the technical process.

Peripheral unit PG may be installed in any position and can thus be aligned in accordance with the requirements at the installation location or in accordance with the requirements for the type of application. As a result of the fact that the connections which carry the signal or supply voltage remain completely within the respective module housings, excellent protection can be achieved against undesirable emitted or immitted electromagnetic radiation. Should the protection of the module housings not be adequate in the case of module housings which are not metallic or are only partially metallic, screening may also be applied, in addition, either on the inside or the outside of the module housings.

In another embodiment, which is not illustrated, it would also be conceivable, as already indicated, for module lower parts, BMU, EMU, and/or module upper parts, BMO, EMO, to have special positively locking elements instead of the profile which permits them to be attached in series, the elements making it possible also to attach modules, BM, EM, in series in a positively locking manner. One example of such positively locking elements would be pins which engage in corresponding recesses in adjacent module, BM, EM. If the pins themselves have recesses, it is possible to lock module, BM, EM, in the condition of being attached in series, by inserting pin- or wedge-shaped fastening means into the recesses in the pins on adjacent module, BM, EM. In another embodiment, which is not illustrated, the pin- or wedge-shaped fastening means are inserted into corresponding recesses in module upper part, BMO, EMO, the fastening means extending at least into the recesses in the pins in adjacent module, BM, EM, which is attached in series, so that this adjacent module, BM, EM, is locked in a positively locking manner.

What is claimed is:

1. A modular peripheral unit for at least one of controlling and monitoring a technical process, comprising:

a plurality of modules connectable to at least one of actuators and sensors for at least one of controlling and monitoring the technical process, the plurality of modules including a base module receiving a supply voltage, and at least one expansion module connectable in series to the base module, each respective module of the plurality of modules including a respective module upper part and a respective module lower part, each respective module lower part including substantially U-shaped contact elements for connecting each respective module lower part to another respective module lower part in series, each of the substantially U-shaped contact elements having a first limb and second limb, the first limb of each of the substantially U-shaped contact elements being positioned within the respective module when the respective module upper part is mounted on the respective module lower part, the first limb of each of the substantially U-shaped contact elements of the respective module lower part together forming a respective internal contact arrangement, the second limb of each of the substantially U-shaped contact elements of the respective module lower part being positioned outside the respective module when the respective module upper part is mounted on the respective module lower part, the second limb of each of the substantially U-shaped contact elements of the respective module lower part together forming a respective external contact arrangement, the respective external contact arrangement of one of the plurality of modules engaging in one of the at least one expansion modules when the one of the at least one expansion modules is connected in series such that the respective external contact arrangement of the one of the plurality of modules is opposite the respective internal contact arrangement of the one of the at least one expansion modules.

2. The modular peripheral unit according to claim 1, wherein the substantially U-shaped contact elements include junctions.

3. The modular peripheral unit according to claim 1, wherein a first subset of the substantially U-shaped contact elements provide the supply voltage, and a second subset of the substantially U-shaped contact elements provide signal voltages.

4. The modular peripheral unit according to claim 1, wherein each respective module upper part includes a respective printed circuit board, the respective printed circuit board including an electrical circuit for at least one of controlling and monitoring the technical process.

5. The modular peripheral unit according to claim 4, wherein the respective external contact arrangement of at least one of the plurality of modules is coupled to the respective internal contact arrangement of the at least one of the plurality of modules via a direct electrically conductive connecting element, the supply voltage being looped through the at least one of the plurality of modules via the direct electrically conductive connecting element, and wherein the signal voltages are looped through the at least one of the plurality of modules via the respective printed circuit board.

6. The modular peripheral unit according to claim 4, wherein only the supply voltages are selected on each respective printed circuit board, and wherein the selected supply voltages are provided to the respective printed circuit board using predetermined contact elements.

* * * * *